United States Patent
Zhou et al.

(10) Patent No.: US 12,422,465 B2
(45) Date of Patent: Sep. 23, 2025

(54) IN-SITU CHIP DESIGN FOR PULSE IV SELF-HEATING EVALUATION

(71) Applicant: International Business Machines Corporation, Armonk, NY (US)

(72) Inventors: Huimei Zhou, Albany, NY (US); Yoo-Mi Lee, Montvale, NJ (US); Jingyun Zhang, Albany, NY (US); Miaomiao Wang, Albany, NY (US); Huiming Bu, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 18/456,775

(22) Filed: Aug. 28, 2023

(65) Prior Publication Data

US 2025/0076365 A1    Mar. 6, 2025

(51) Int. Cl.
G01R 31/26 (2020.01)

(52) U.S. Cl.
CPC ................................ G01R 31/2628 (2013.01)

(58) Field of Classification Search
CPC .................... G01R 31/2628; G01R 31/2621
See application file for complete search history.

(56) References Cited

U.S. PATENT DOCUMENTS

| | | | |
|---|---|---|---|
| 5,905,384 A | 5/1999 | Inoue et al. | |
| 7,362,121 B1 | 4/2008 | Conn et al. | |
| 7,616,014 B1 | 11/2009 | Sobolewski | |
| 8,549,462 B2 | 10/2013 | Malladi et al. | |
| 9,823,294 B1* | 11/2017 | Aiello | G11C 29/021 |
| 9,824,745 B1* | 11/2017 | Lee | G11C 11/403 |
| 9,952,274 B2 | 4/2018 | Jenkins et al. | |
| 10,048,137 B2 | 8/2018 | Lee et al. | |
| 10,134,484 B2* | 11/2018 | Kwak | G01R 31/31701 |
| 2004/0113642 A1* | 6/2004 | Sugimoto | G01R 31/31926 324/762.01 |
| 2005/0149788 A1* | 7/2005 | Jeon | G11C 29/56 714/724 |
| 2007/0262359 A1 | 11/2007 | Hyde et al. | |
| 2008/0185400 A1* | 8/2008 | Griffith | B08B 1/14 222/196 |
| 2008/0238453 A1* | 10/2008 | Lo | G01R 31/2884 324/754.07 |

(Continued)

OTHER PUBLICATIONS

Anonymous, "Pulse/Waveform Generation with Integrated Measurement Capability," Keysight, URL: https://www.keysight.com/us/en/assets/7018-02288/technical-overviews/5990-4567.pdf; Retrieved: Aug. 1, 2023, 39 pages.

(Continued)

Primary Examiner — Lee E Rodak
Assistant Examiner — Zannatul Ferdous
(74) Attorney, Agent, or Firm — CANTOR COLBURN LLP; Matt Zehrer (57) ABSTRACT

An in-situ chip design is provided for self-heating free characterization of a device under test (DUT) with a short time constant. The in-situ chip design includes a pulse generator configured to output a pulse to the DUT and a buffering circuit arranged between the pulse generator and the DUT. The buffering circuit includes a first switch and an adjustable buffer circuit in parallel with the first switch and being controllable to apply one of various degrees of buffering to the pulse.

23 Claims, 4 Drawing Sheets

(56) References Cited

U.S. PATENT DOCUMENTS

2010/0318313 A1* 12/2010 Agarwal ........ G01R 31/318511
702/117
2019/0004113 A1* 1/2019 Kim ................ G11C 29/56004
2020/0355777 A1* 11/2020 Tong ................ G01R 31/31905

OTHER PUBLICATIONS

Anonymous, "Pulsed-IV Parametric Test Solutions," Keysight, URL: https://www.keysight.com/us/en/assets/7018-02070/technical-overviews/5990-3672.pdf; Retrieved: Aug. 1, 2023, 13 pages.

Mukhopadhyay et al., "An unique methodology to estimate the thermal time constant and dynamic self heating impact for accurate reliability evaluation in advanced finfet technologies" IEEE, 17.4.1, 2018, 4 pages.

Nguyen et al., "Electrical characterization of the self-heating effect in oxide semiconductor thin-film transistors using pulse-based measurements," IEEE, vol. 65, No. 6, 2018, pp. 2492-2497.

Zhou et al., "Self Heating Extraction Design and Methodology with Power Consumption Correction," U.S. Appl. No. 17/848,616, filed Jun. 24, 2022.

* cited by examiner

IN-SITU CHIP DESIGN FOR PULSE IV SELF-HEATING EVALUATION

BACKGROUND

The present invention generally relates to semiconductor devices. More specifically, the present invention relates to measuring output characteristics of semiconductor devices using an in-situ chip design for pulse IV self-heating evaluation.

Semiconductor devices typically generate heat as they are operated and dissipate power. For example, under some circumstances, complementary metal oxide semiconductor (CMOS) field effect transistors (FETs) experience heating so that they can be sufficiently hotter than the surrounding environment. This can be referred to as the self-heating effect. Large temperature raises can impact the reliability of the semiconductor device, but can also impact the electrical characteristics of the transistors. Elevated temperatures reduce charge carrier mobility in semiconductor devices, and reduce the threshold voltage of semiconductor devices, such as field effect transistors (FETs), resulting in drain currents, which differ from what would be obtained if they didn't experience self-heating.

SUMMARY

Embodiments of the invention are directed to an in-situ chip design for self-heating free characterization of a device under test (DUT) with a short time constant. A non-limiting example of the in in-situ chip design includes a pulse generator configured to output a pulse to the DUT and a buffering circuit arranged between the pulse generator and the DUT. The buffering circuit includes a first switch and an adjustable buffer circuit in parallel with the first switch and being controllable to apply one of various degrees of buffering to the pulse.

Embodiments of the invention are directed to an in-situ chip design for self-heating free characterization of a device under test (DUT) with a short time constant. A non-limiting example of the in in-situ chip design includes a pulse generator configured to output a pulse to the DUT and a buffering circuit arranged between the pulse generator and the DUT. The buffering circuit includes a first switch and an adjustable buffer circuit in parallel with the first switch and being controllable to apply one of various degrees of buffering to the pulse whereby an increase in a degree of buffering to the pulse corresponds to a faster rising pulse being output to the DUT.

Embodiments of the invention are directed to an in-situ chip design for self-heating free characterization of a device under test (DUT) with a short time constant. A non-limiting example of the in-situ chip design includes first and second pulse generators respectively configured to output first and second pulses to a gate and a drain of the DUT, respectively, and first and second buffering circuits respectively arranged between the first and second pulse generators and the gate and the drain of the DUT, respectively. Each of the first and second buffering circuits includes a first switch and an adjustable buffer circuit in parallel with the first switch and being controllable to apply one of various degrees of buffering to the first and second pulses, respectively.

Embodiments of the invention are directed to an in-situ chip design for self-heating free characterization of a device under test (DUT) with a short time constant. A non-limiting example of the in-situ chip design includes first and second pulse generators respectively configured to output first and second pulses to a gate and a drain of the DUT, respectively, and first and second buffering circuits respectively arranged between the first and second pulse generators and the gate and the drain of the DUT, respectively. Each of the first and second buffering circuits includes a first switch and an adjustable buffer circuit in parallel with the first switch and being controllable to apply one of various degrees of buffering to the first and second pulses, respectively, whereby an increase in a degree of buffering to the first and second pulses corresponds to faster rising first and second pulses being output to the DUT.

Embodiments of the present invention are directed to method of operating an-situ chip design for self-heating free characterization of a device under test (DUT) with a short time constant. A non-limiting example of the method includes enabling a pulse IV generator to output a pulse to the DUT, executing pulse IV characterization for the DUT at multiple temperatures, adjusting a power range of the pulse to have an adjusted power, re-executing the pulse IV characterization for the DUT at the multiple temperatures and at the adjusted power and calibrating a temperature versus power relationship of the DUT from results of the executing and the re-executing, align with DC power and self heating temperature.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, an "output characteristic" of an electrical device can be an I-V characteristic curve, which is short for a current-voltage characteristic curve or simply an IV curve. An IV curve is a graphical curve that can used to define certain operations within an electrical circuit. As the name suggests, an IV curve illustrates a relationship between current flowing through the electronic device and a voltage applied across its terminals. In some cases, an IV curve can be used as a tool to determine and understand basic parameters of the electrical device and to mathematically model certain behaviors within the electronic circuit.

During operations, semiconductor devices can experience self-heating since a given device will produce heat as it dissipates power. Self-heating may result in thermal coupling when sufficient heat is produced to affect the operation of the devices themselves and surrounding devices. For example, the gain of a device in a design structure or circuit may be decreased as a result of heating caused by the operation of other devices of the design structure or circuit. Unmodeled thermal interaction effects may result in unpredicted behavior of semiconductor devices and circuits, as well as shorter-than-expected component life and/or other undesirable effects.

To reduce or avoid negative effects of thermal coupling, such effects can be considered during design processes, particularly for high-performance and/or high-power applications. Indeed, as the current density capability of components or devices of a semiconductor device or design structure increases, self-heating may become more pronounced, and predicting self-heating effects may figure more prominently in efficient and cost-effective placement of the components or devices in a design structure or circuit.

In an exemplary case, when one device is powered on, that device may generate heat due to self-heating, which may result in thermal coupling and may affect other proximal devices, each of which may exhibit its own thermal response. To assess the impact self-heat, a self-heating free characterization of the device can be measured using pulsed current-voltage (pulse IV) measurement processing.

A problem with using pulse IV measurement processing with semiconductor devices, in particular, is that self-heating of those devices can occur on very short timescales (e.g., ~10 ns or less) that are shorter than conventional pulse IV measurement processing timescales in advanced technology.

That is, that by the time convention pulse IV measurement can be executed, a device-under-test (DUT) may already be at least partially self-heated. While, the response of pulse IV measurement processing can be affected through the use of cabling, the use of cabling makes it more difficult to achieve self-heating status of the DUT with a short time constant.

Turning now to an overview of the aspects of the invention, one or more embodiments of the invention address the above-described shortcomings of the prior art by providing for an-situ chip design that is combined with a DUT to evaluate self-heating by pulse IV measurement.

The above-described aspects of the invention address the shortcomings of the prior art by providing an in-situ chip design for ascertaining a time constant of a DUT. The in-situ chip design includes a pulse generator configured to output a pulse to the DUT and a buffering circuit arranged between the pulse generator and the DUT. The buffering circuit includes a first switch and an adjustable buffer circuit in parallel with the first switch and being controllable to apply one of various degrees of buffering to the pulse.

Figure 1A:
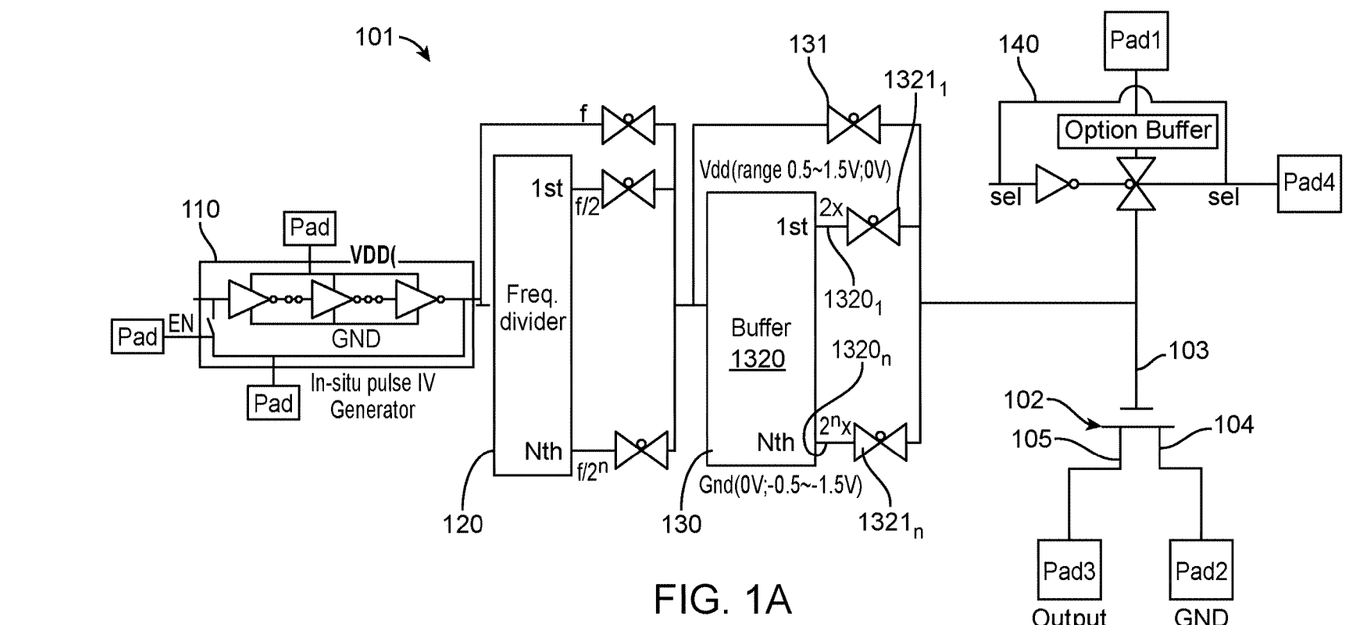
FIG. 1A is a schematic circuit diagram of an in-situ chip design with a first optional circuit in accordance with one or more embodiments of the present invention.

Turning now to a more detailed description of aspects of the present invention, FIG. 1A depicts an in-situ chip design 101 for ascertaining a time constant of a DUT 102, such as a transistor or, more particularly, one of an n-doped field effect transistor (NFET) and a p-doped field effect transistor (PFET) having a gate 103, a source 104 and a drain 105. The in-situ chip design 101 includes a pulse generator 110, a frequency selector 120 and a buffering circuit 130. The pulse generator 110 is configured to output a pulse (i.e., an alternating current (AC) pulse) to the DUT 102. The frequency selector 120 is arranged between the pulse generator 110 and the buffering circuit 130 and is configured to select one of varying frequencies for the pulse. The buffering circuit 130 is arranged between the pulse generator 110 (and the frequency selector 120) and the gate 103 of the DUT 102. The buffering circuit 130 includes a first switch 131 and an adjustable buffer circuit 132. The adjustable buffer circuit 132 is disposed in parallel with the first switch 131. The first switch 131 and the adjustable buffer circuit 132 are controllable to apply one of various degrees of buffering to the pulse (i.e., zero buffering, 2x buffering, . . . , $2^n$x buffering). The adjustable buffer circuit 132 includes a buffer 1320 with buffer outputs $1320_1, \ldots, 1320_n$ of varying buffer capabilities and second switches $1321_1, \ldots, 1321_n$. The second switches $1321_1, \ldots, 1321_n$ are respectively disposed in series with a corresponding one of the buffer outputs $1320_1, \ldots, 1320_n$.

As shown in FIG. 1A, the in-situ chip design 101 can further include a first optional circuit 140 with a selectable force pad and a selectable control path to the DUT 102. Generating a fast rise pulse using the in-situ chip design 101 is thus executed as follows: the pulse generator 110 is enabled, pad4 of the first optional circuit 140 is selected "low" and zero voltage is applied to source pad2 of the source 104 of the DUT 102. Drain voltage Vdd and AC current can then be sensed at drain pad3 of the drain 105 of the DUT 102. Generation of an external gate pulse using the in-situ chip design 101 is thus executed by disabling the pulse generator 110, pad4 being connected to a pass gate circuit when it is selected "on", pad 1 being used to sense voltage at gate while an extra buffer disposed from the pad connection could be disabled by selected "off", drain voltage Vdd is applied to pad1 of the first optional circuit 140 and zero voltage is applied to source pad2 of the source 104 of the DUT 102. The drain current Vdd can then be sensed at the drain pad pad3 of the drain 105 of the DUT 102.

Figure 1B:
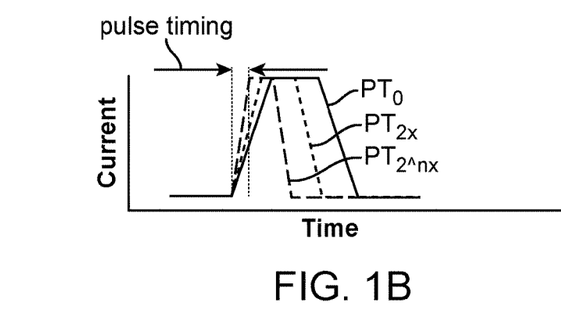
FIG. 1B is a graphical illustration of pulse timing of a pulse IV measurement pulse using increasing buffering in accordance with embodiments of the invention.

With continued reference to FIG. 1A and with additional reference to FIG. 1B, the buffering circuit 130 is controlled to increase the buffering applied to the pulse generated by the pulse generator 110. For example, when the first switch 131 is closed and the second switches $1321_1, \ldots, 1321_n$ are open, zero buffering is applied and the pulse timing $PT_0$ is correspondingly long. When the first switch 131 is open and the second switch $1321_1$ is the only second switch that is closed, 2x buffering is applied and the pulse timing $PT_{2x}$ is correspondingly decreased as compared to $PT_0$. When the first switch 131 is open and the second switch $1321_n$ is the only second switch that is closed, $2^n$x buffering is applied and the pulse timing $PT_{2^{\wedge}nx}$ is correspondingly decreased as compared to $PT_0$ and $PT_{2x}$.

For a given DUT 102, it is possible to develop and/or ascertain a relationship between a temperature response of the DUT 102 and power applied to the DUT 102 by sequentially executing pulse IV measurement of the DUT 102 at varying temperatures at with varied buffering (i.e., varied pulse widths and pulse rising time control).

Figure 2:
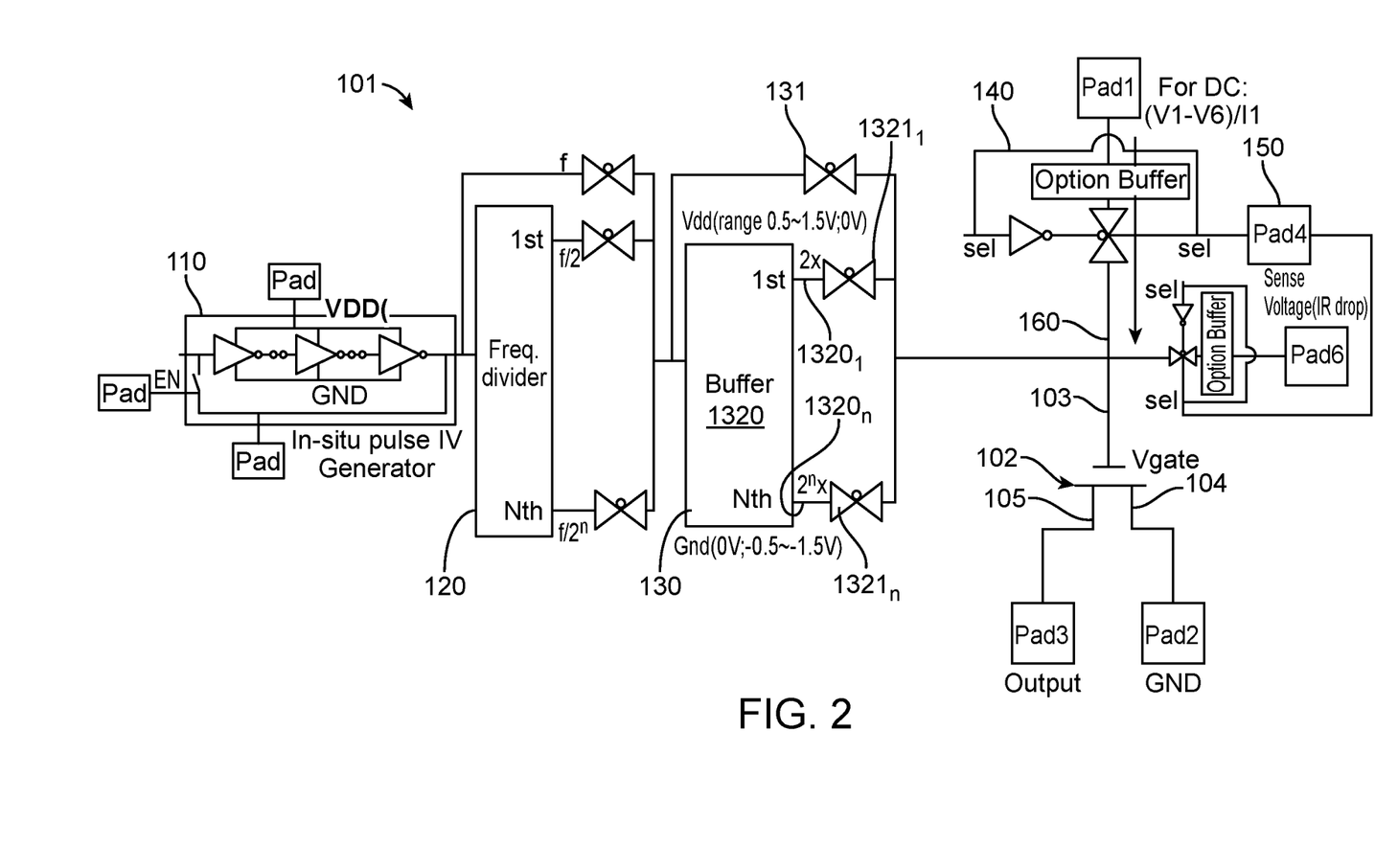
FIG. 2 is a schematic circuit diagram of the in-situ chip design of FIG. 1 with first and second optional circuits in accordance with one or more embodiments of the present invention.

With reference to FIG. 2, the in-situ chip design 101 of FIG. 1 can further include a second optional circuit 150 with a selectable sensor pad for sensing a voltage drop to the DUT 102. In this case, the first and second optional circuits 140 and 150 can form a Kelvin connection 160 with a single force pad, a single sensor pad and a selected pass gate. Generating a fast rise pulse using the in-situ chip design 101 of FIG. 2 is thus executed as follows: the pulse generator 110 is enabled, pad4 of the first optional circuit 140 is not selected and pad1 and pad4 are disconnected from the whole circuit and the DUT 102 Drain voltage Vdd and AC current can then be sensed at drain pad3 of the drain 105 of the DUT 102. Generation of an external gate pulse using the in-situ chip design 101 of FIG. 2 is thus executed by disabling the pulse generator 110, pad4 of the first optional circuit is selected "high", drain voltage Vdd is applied to pad1 of the first optional circuit 140 and zero voltage is applied to source pad2 of the source 104 of the DUT 102. Here, voltage can be sensed at pad6 of the second optional circuit 150 to obtain a resistance from pad1 of the first optional circuit 140 to the Kelvin connection 160 whereby a corrected resistance and an estimated exact voltage on the gate 103 of the DUT 102 can be determined.

Figure 3:
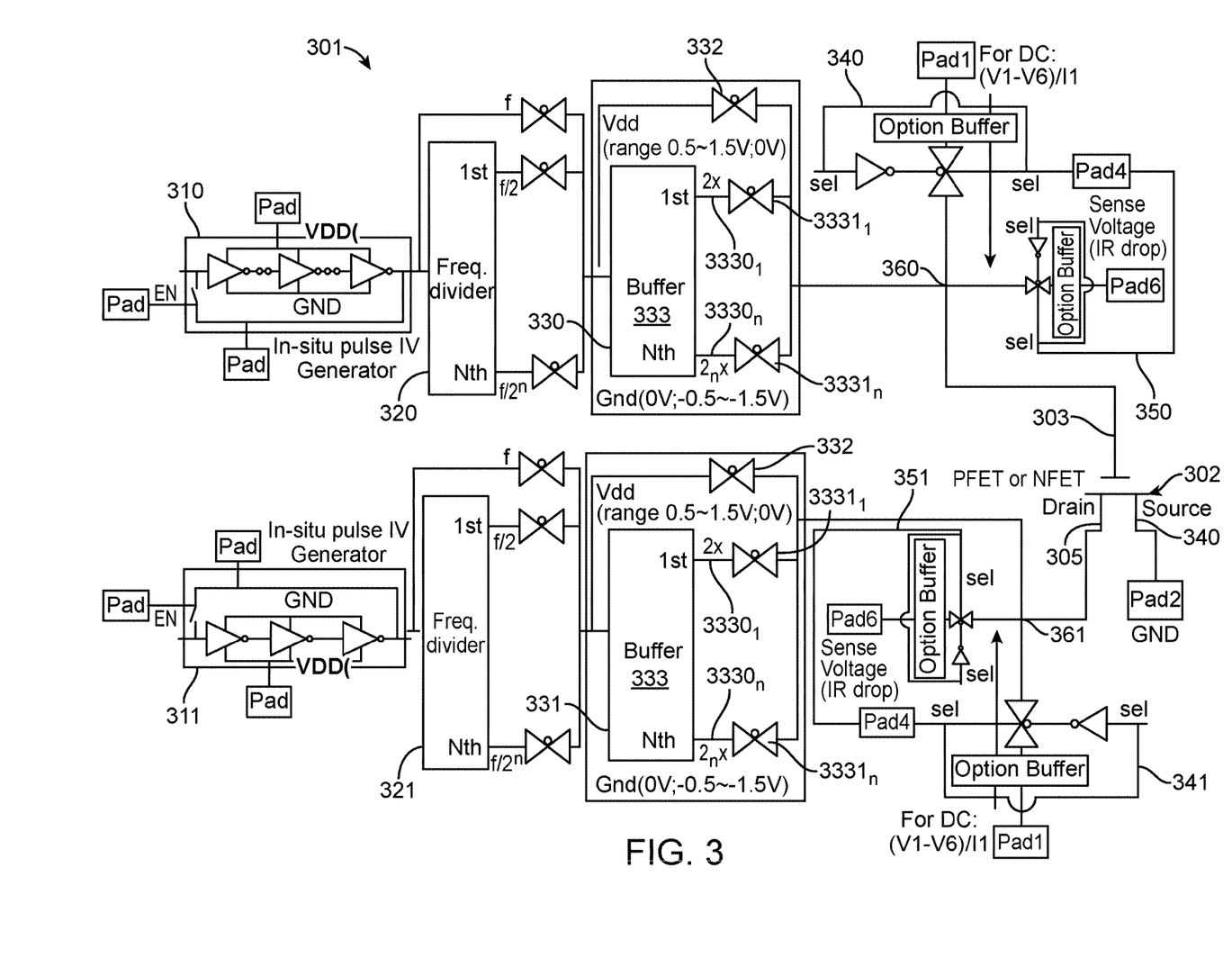
FIG. 3 is a schematic circuit diagram of a further in-situ chip design with first and second optional circuits in accordance with one or more embodiments of the present invention.

With reference to FIG. 3, an in-situ chip design 301 is provided for ascertaining a time constant of a DUT 302 such as a transistor or, more particularly, one of an n-doped field effect transistor (NFET) and a p-doped field effect transistor (PFET) having a gate 303, a source 304 and a drain 305. The in-situ chip design 301 includes first and second pulse generators 310, 311, first and second frequency selectors 320, 321 and first and second buffering circuits 330, 331. The first and second pulse generators 310, 311 are respectively configured to output first and second pulses to the gate 303 and the drain 305 of the DUT 302, respectively. The first and second frequency selectors 320, 321 are respectively arranged between the first and second pulse generators 310, 311 and the first and second buffering circuits 330, 331, respectively, and are configured to select one of varying frequencies for the first and second pulses, respectively. The first and second buffering circuits 330, 331 are respectively arranged between the first and second pulse generators 310, 311 (and the first and second frequency selectors 320, 321, respectively) and the gate 303 and the drain 305 of the DUT 302, respectively. Each of the first and second buffering circuits 330, 331 includes a first switch 332 and an adjustable buffer circuit 333 in parallel with the first switch 332 and is controllable to apply one of various degrees of buffering to the first and second pulses, respectively. The adjustable buffer circuit 333 of each of the first and 2" buffering circuits 330, 331 includes a buffer 3330 with buffer outputs $3330_1, \ldots, 3330_n$ of varying buffer capabilities and second switches $3331_1, \ldots, 3331_n$. The second switches $3331_1, \ldots, 3331_n$ are respectively disposed in series with a corresponding one of the buffer outputs $3330_1, \ldots, 3330_n$.

As shown in FIG. 3, the in-situ chip design 301 can further include a first optional circuit 340 with a first selectable force pad and a first selectable control path to the gate 303 of the DUT 302 and a second optional circuit 341 with a second selectable force pad and a second selectable control path to the drain 305 of the DUT 302. In addition, the in-situ chip design 301 can also include a first additional optional circuit 350 with a first additional selectable force/sensor pad for sensing a voltage on the gate 303 of the DUT 302 (could also be used for force DC voltage with selected pad4 and disabling whole in-situ generator) and a second additional optional circuit 351 with a second additional selectable sensor pad for sensing a voltage drop to the drain 305 of the DUT 302. Here again, the first optional circuit 340 and the first additional optional circuit 350 can form a first Kelvin connection 360 with a first single force pad and a first single sensor pad and the second optional circuit 341 and the second additional optional circuit 351 can form a second Kelvin connection 361 with a second single force pad and a second single sensor pad.

Operations of the in-situ chip design 301 of FIG. 3 are similar to those of the in-situ chip design 101 of FIGS. 1 and 2 and need not be re-described herein.

Figure 4:
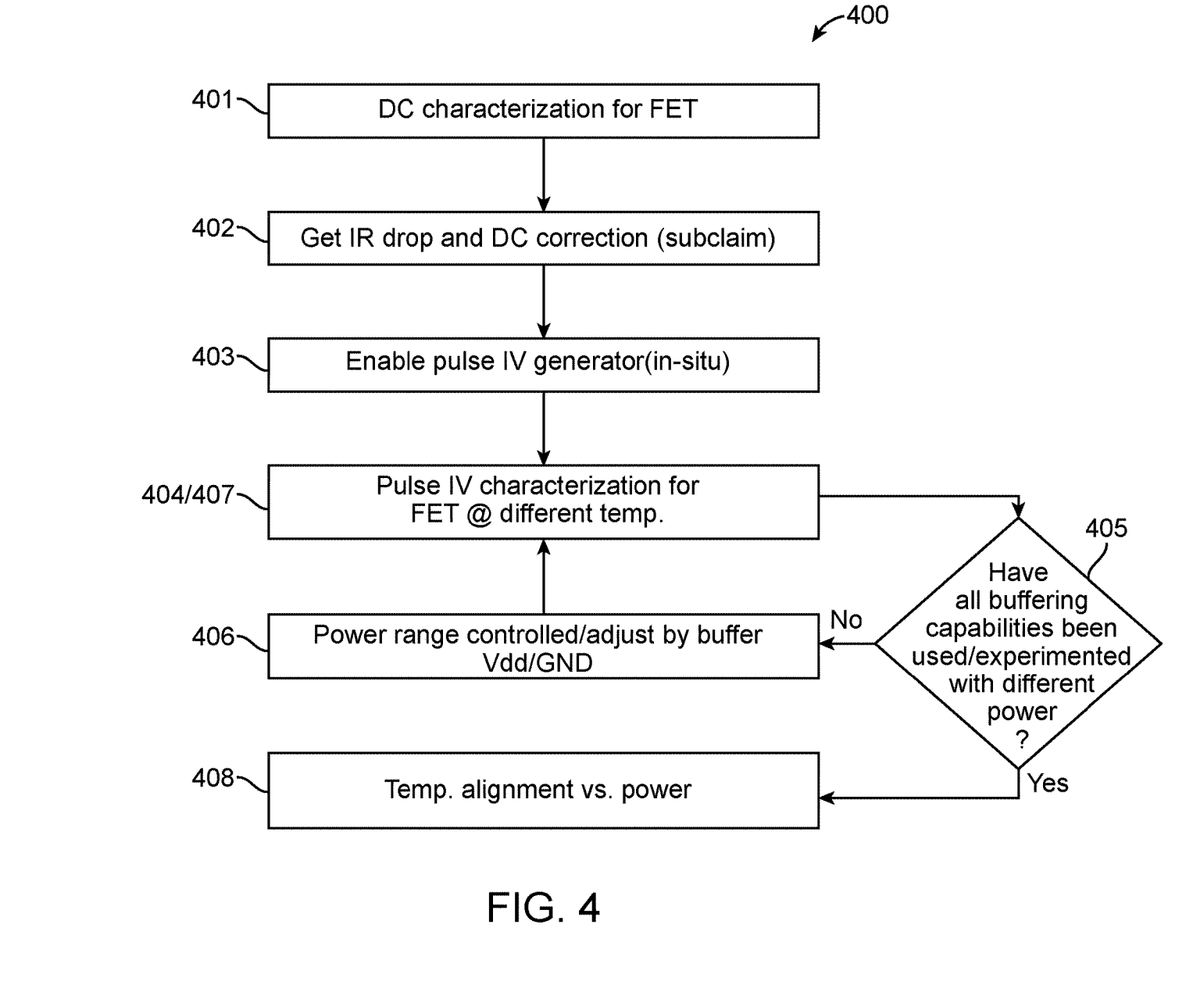
FIG. 4 is a flow diagram illustrating a method of operating an in-situ chip design in accordance with one or more embodiments of the present invention.

With reference to FIG. 4, a method 400 of operating an-situ chip design is provided for evaluating self-heating of a DUT with a short time constant, such as the in-situ chip design 101 of FIGS. 1 and 2 and the in-situ chip design 301 of FIG. 3. The method 400 includes characterizing a response of the DUT to DC (block 401), obtaining a voltage drop and a DC correction of the DUT (block 402), enabling a pulse IV generator to output an AC pulse to the DUT (block 403), executing pulse IV characterization for the DUT at multiple temperatures (block 404) and determining whether all power ranges/buffering capabilities have been used/experimented with (block 405). If all power ranges/buffering capabilities have not yet been used/experimented with, the method further includes adjusting a power range of the pulse (block 406) and re-executing the pulse IV characterization for the DUT at the multiple temperatures and at the adjusted power range (block 407). If all power ranges/buffering capabilities have been used/experimented with, the method further includes calibrating a temperature versus power relationship of the DUT with AC and DC (block 408) from results of the executing of block 404 and the re-executing of block 407. In accordance with embodiments, the adjusting of the power range of block 406 can include controlling a buffering circuit as described above and the controlling of the buffering circuit can include applying one of zero buffering and one of varied buffering degrees to the pulse.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An in-situ chip design for self-heating free characterization of a device under test (DUT) with a short time constant, the in-situ chip design comprising:
   a transistor disposed as the DUT and comprising a drain pad, a source pad and a gate;
   a pulse generator configured to output a pulse to the gate of the DUT;
   a buffering circuit arranged between the pulse generator and the DUT; and
   a first optional circuit with a selectable force pad and a selectable control path to the DUT, the selectable control path comprising:
     a switch to which the selectable force pad is connected;
     a first optional circuit pad; and
     an extra buffer electrically interposed between the first optional circuit pad and the switch,
   the buffering circuit comprising a first switch and an adjustable buffer circuit in parallel with the first switch and being controllable to apply one of various degrees of buffering to the pulse.

2. The in-situ chip design according to claim 1, further comprising a frequency selector arranged between the pulse generator and the buffering circuit and configured to select one of varying frequencies for the pulse.

3. The in-situ chip design according to claim 1, wherein the adjustable buffer circuit comprises:
   a buffer with buffer outputs of varying buffer capabilities; and
   second switches respectively disposed in series with a corresponding one of the buffer outputs.

4. The in-situ chip design according to claim 1, wherein the DUT is one of an N-doped field effect transistor (NFET) and a P-doped field effect transistor (PFET).

5. The in-situ chip design according to claim 1, wherein:
   the pulse generator is enabled, the selectable force pad is selected low and zero voltage is applied to the source pad to generate a fast rise pulse whereupon drain voltage and alternating current are sensible at the drain pad, and
   the pulse generator is disabled, the selectable force pad is selected on, the first optional circuit pad is used to sense voltage at the gate with the extra buffer disabled, drain voltage is applied to the first optional circuit pad and zero voltage is applied to the source pad to generate an external gate pulse whereupon drain current is sensed at the drain pad.

6. The in-situ chip design according to claim 5, further comprising a second optional circuit with a selectable sensor pad for sensing a voltage drop to the DUT.

7. The in-situ chip design according to claim 6, wherein the first and second optional circuits form a Kelvin connection with a single force pad and a single sensor pad.

8. A method of operating an-situ chip design according to claim 1 for the self-heating free characterization of the DUT with the short time constant, the method comprising:
   enabling an in-situ pulse IV generator to output the pulse to the DUT;
   executing in-situ pulse IV characterization for the DUT at multiple temperatures;
   adjusting a power range of the pulse to have an adjusted power;
   re-executing the in-situ pulse IV characterization for the DUT at the multiple temperatures and at the adjusted power; and
   calibrating a temperature versus power relationship of the DUT from results of the executing and the re-executing.

9. The method according to claim 8, wherein:
   the method further comprises determining whether the power range of the pulse can be adjusted, and
   the adjusting of the power range is executed when it is determined that the power range can be adjusted.

10. The method according to claim 8, further comprising obtaining a voltage drop and a DC correction of the DUT.

11. The method according to claim 8, wherein the adjusting of the power range comprises controlling the buffering circuit.

12. The method according to claim 11, wherein the controlling of the buffering circuit comprises applying one of zero buffering and one of varied buffering degrees to the pulse.

13. An in-situ chip design for self-heating free characterization of a device under test (DUT) with a short time constant, the in-situ chip design comprising:
 a transistor disposed as the DUT and comprising a drain pad, a source pad and a gate;
 a pulse generator configured to output a pulse to the DUT;
 a buffering circuit arranged between the pulse generator and the DUT; and
 at least a first optional circuit with a selectable force pad and a selectable control path to the DUT, the selectable control path comprising:
  a switch to which the selectable force pad is connected;
  a first optional circuit pad; and
  an extra buffer electrically interposed between the first optional circuit pad and the switch,
 the buffering circuit comprising a first switch and an adjustable buffer circuit in parallel with the first switch and being controllable to apply one of various degrees of buffering to the pulse whereby an increase in a degree of buffering to the pulse corresponds to a faster rising pulse being output to the DUT.

14. The in-situ chip design according to claim 13, wherein the adjustable buffer circuit comprises:
 a buffer with buffer outputs of varying buffer capabilities; and
 second switches respectively disposed in series with a corresponding one of the buffer outputs.

15. An in-situ chip design for self-heating free characterization of a device under test (DUT) with a short time constant, the in-situ chip design comprising:
 a transistor disposed as the DUT and comprising a drain pad, a source pad and a gate;
 first and second pulse generators respectively configured to output first and second pulses to the gate and the drain of the DUT, respectively;
 first and second buffering circuits respectively arranged between the first and second pulse generators and the gate and the drain of the DUT, respectively; and
 at least a first optional circuit with a selectable force pad and a selectable control path to the DUT, the selectable control path comprising:
  a switch to which the selectable force pad is connected;
  a first optional circuit pad; and
  an extra buffer electrically interposed between the first optional circuit pad and the switch,
 each of the first and second buffering circuits comprising a first switch and an adjustable buffer circuit in parallel with the first switch and being controllable to apply one of various degrees of buffering to the first and second pulses, respectively.

16. The in-situ chip design according to claim 15, further comprising first and second frequency selectors respectively arranged between the first and second pulse generators and the first and second buffering circuits, respectively, and configured to select one of varying frequencies for the first and second pulses, respectively.

17. The in-situ chip design according to claim 15, wherein the adjustable buffer circuit of each of the first and second buffering circuits comprises:
 a buffer with buffer outputs of varying buffer capabilities; and
 second switches respectively disposed in series with a corresponding one of the buffer outputs.

18. The in-situ chip design according to claim 15, wherein the DUT is one of an N-doped field effect transistor (NFET) and a P-doped field effect transistor (PFET).

19. The in-situ chip design according to claim 15, further comprising:
 a second optional circuit with a second selectable force pad and a second selectable control path to the drain of the DUT.

20. The in-situ chip design according to claim 19, further comprising:
 a first additional optional circuit with a first additional selectable sensor pad for sensing a voltage drop to the gate of the DUT; and
 a second additional optional circuit with a second additional selectable sensor pad for sensing a voltage drop to the drain of the DUT.

21. The in-situ chip design according to claim 20, wherein:
 the first optional circuit and the first additional optional circuit form a first Kelvin connection with a first single force pad and a first single sensor pad, and
 the second optional circuit and the second additional optional circuit form a second Kelvin connection with a second single force pad and a second single sensor pad.

22. An in-situ chip design for self-heating free characterization of a device under test (DUT) with a short time constant, the in-situ chip design comprising:
 a transistor disposed as the DUT and comprising a drain pad, a source pad and a gate;
 first and second pulse generators respectively configured to output first and second pulses to the gate and the drain of the DUT, respectively;
 first and second buffering circuits respectively arranged between the first and second pulse generators and the gate and the drain of the DUT, respectively; and
 at least a first optional circuit with a selectable force pad and a selectable control path to the DUT, the selectable control path comprising:
  a switch to which the selectable force pad is connected;
  a first optional circuit pad; and
  an extra buffer electrically interposed between the first optional circuit pad and the switch,
 each of the first and second buffering circuits comprising a first switch and an adjustable buffer circuit in parallel with the first switch and being controllable to apply one of various degrees of buffering to the first and second pulses, respectively, whereby an increase in a degree of buffering to the first and second pulses corresponds to faster rising first and second pulses being output to the DUT.

23. The in-situ chip design according to claim 22, wherein the adjustable buffer circuit of each of the first and second buffering circuits comprises:
 a buffer with buffer outputs of varying buffer capabilities; and
 second switches respectively disposed in series with a corresponding one of the buffer outputs.

* * * * *